(12) United States Patent
Taktsu et al.

(10) Patent No.: US 6,920,703 B2
(45) Date of Patent: Jul. 26, 2005

(54) MICROSTRUCTURE DRYING TREATMENT METHOD AND ITS APPARATUS AND ITS HIGH PRESSURE VESSEL

(75) Inventors: Hisayuki Taktsu, Oarai (JP); Toru Iwaya, Hitachiota (JP); Koichi Miyazawa, Mito (JP); Sakae Koubori, Katsura (JP)

(73) Assignee: Hitachi Science Systems, Ltd., Hitachinaka (JP)

( * ) Notice: Subject to any disclaimer, the term of this patent is extended or adjusted under 35 U.S.C. 154(b) by 0 days.

(21) Appl. No.: 10/837,702

(22) Filed: May 4, 2004

(65) Prior Publication Data

US 2005/0050757 A1 Mar. 10, 2005

(30) Foreign Application Priority Data

May 7, 2003 (JP) ........................ 2003-128592

(51) Int. Cl.⁷ .................................. F26B 3/00
(52) U.S. Cl. ................. 34/405; 34/415; 34/62; 34/68; 34/76; 134/902
(58) Field of Search .................. 34/402, 405, 413, 34/414, 415, 60, 61, 62, 68, 76; 134/61, 902; 430/311, 322

(56) References Cited

U.S. PATENT DOCUMENTS

| | | | | |
|---|---|---|---|---|
| 4,638,646 A | * | 1/1987 | Koseki et al. | .......... 62/478 |
| 5,156,173 A | * | 10/1992 | Keyser et al. | .......... 134/61 |
| 5,246,023 A | * | 9/1993 | Breunsbach et al. | .......... 134/57 R |
| 6,358,673 B1 | | 3/2002 | Namatsu | |
| 6,554,507 B2 | | 4/2003 | Namatsu | |
| 6,804,900 B2 | * | 10/2004 | Kawakami et al. | .......... 34/351 |
| 2002/0132192 A1 | | 9/2002 | Namatsu | |

FOREIGN PATENT DOCUMENTS

| JP | 9-1092 | 1/1997 |
|---|---|---|
| JP | 2000-91180 | 3/2000 |
| JP | 2000-138156 | 5/2000 |
| JP | 2000-223467 | 8/2000 |

* cited by examiner

*Primary Examiner*—Stephen Gravini
(74) *Attorney, Agent, or Firm*—Dickstein Shapiro Morin & Oshinsky LLP (57) ABSTRACT

The object of the present invention is to provide a microstructure drying treatment method by which a substrate having a microstructure has a fine pattern of less than 30 nm and a large-caliber substrate of 100 mm or more can be dried uniformly and in a short time without generating pattern collapse, and its apparatus and its high pressure vessel. The present invention is a microstructure drying treatment method of introducing a fluid that is gas at normal temperature and pressure and is liquid under high pressure inside a high pressure vessel in which a substrate having a microstructure in a state immersed in or wet with a rinsing liquid in a liquid or supercritical state. The method forms a specific gravity difference between the rinsing liquid and fluid inside the high pressure vessel and collects the rinsing liquid to the upper side or lower side of the high pressure vessel by changing at least one side of the temperature and pressure of the fluid and changing the specific gravity of the fluid.

19 Claims, 6 Drawing Sheets

MICROSTRUCTURE DRYING TREATMENT METHOD AND ITS APPARATUS AND ITS HIGH PRESSURE VESSEL

FIELD OF THE INVENTION

The present invention relates to a new microstructure drying treatment method and its apparatus, and its high pressure vessel.

BACKGROUND OF THE INVENTION

Conventionally, after a pattern is formed on a resist deposited on a silicon wafer via exposure, development, rinsing, and drying, a large-scale, high-density, and high-performance device is fabricated through processes of coating, etching, rinsing, and drying. In particular, a resist of a high molecular material is exposed by light, X rays, and an electron beam. In each process, because a fluid, such as a developer or a rinsing liquid, is used especially in a development or rinsing process, a drying process is necessary after a rinsing process.

In this drying process, when the width of space between patterns formed on a resist substrate amounts to less than about 90 nm, Laplace force operates between the patterns by the surface tension (capillarity) of a fluid that is left between the patterns, and pattern collapse occurs. To prevent the pattern collapse caused by the operation of the surface tension of the fluid that is left between the patterns, the drying process for reducing the surface tension that operates between the patterns is used. A method is known, which uses a supercritical fluid of carbon dioxide together with the predetermined pressure vessel shown in JP-A No. 33302/2002.

This conventional drying method that uses supercritical carbon dioxide includes the following basic processes:

(1) A residual liquid in a sample that is insoluble in a fluid in a supercritical state is substituted previously for a rinsing liquid that is soluble in the fluid.

(2) After a sample is installed in a high pressure vessel that works as a drying chamber, the vessel is sealed hermetically. A fluid in a liquid state or supercritical state is introduced into the drying chamber, and a rinsing liquid is substituted for the fluid in the liquid state or supercritical state.

(3) When a fluid in a liquid state is introduced into a drying chamber, the pressure and temperature of the drying chamber are increased to a critical point or more.

(4) A fluid in a supercritical state is drained.

In a conventional drying process, however, when the dimensions, that is, the width of space between patterns formed on a resist substrate amounts to less than about 90 nm, Laplace force operates between the patterns by the surface tension (capillarity) of a fluid that is left between the patterns, and pattern collapse occurred. Still more, if pattern width scales down and amounts to less than about 70 nm even in the drying process that uses a supercritical fluid and a low surface tension rinsing liquid, the pattern collapse cannot be prevented.

Further, a conventional critical point drying method is long in treatment time and requires the time from about several ten minutes to one hour or more. Because a large-diameter substrate having a diameter of 100 mm or more, especially a pattern of less than about 40 nm, is exceedingly inferior in the substitution efficiency of a rinsing liquid and liquid carbon dioxide. Accordingly, because the rinsing liquid that is left between patterns cannot be substituted even if the substitution time of about three hours is set, the surface tension operates between the patterns and pattern collapse can hardly be prevented. Further, the large-caliber substrate could not be dried uniformly.

SUMMARY OF THE INVENTION

The object of the present invention is to provide a microstructure drying treatment method that can dry a microstructure substrate uniformly and in a short time without generating pattern collapse, and its apparatus and its high pressure vessel.

The present invention is a microstructure drying treatment method that introduces a fluid in a liquid or supercritical state into a high pressure vessel in which a substrate having a microstructure in a state immersed in or wet with a rinsing liquid is installed, said fluid being gas at normal temperature and pressure and liquid under high pressure The method forms a specific gravity difference between the rinsing liquid and fluid of the high pressure vessel and collects the rinsing liquid at the upper or lower side inside the high pressure vessel by changing at least one of temperature and pressure of the fluid to change the specific gravity of the fluid.

To be more specific, the present invention is a microstructure drying treatment method that installs a substrate having a microstructure formed via development and rinsing after exposure inside a high pressure vessel in a state immersed in or wet with the rinsing liquid. The method introduces a fluid in a liquid or supercritical state into the high pressure vessel, said fluid being gas at normal temperature and pressure and liquid under high pressure. The method forms a specific gravity difference between the rinsing liquid and fluid inside the high pressure vessel and collects the rinsing liquid to the upper or lower side inside the high pressure vessel by changing at least one of temperature and pressure of the fluid to change the specific gravity of the high pressure vessel. The method drains the collected rinsing liquid to the outside of the high pressure vessel.

Further, desirably, in the present invention, the fluid should be a liquid and be compression-transported to the high pressure vessel by a high pressure pump, and then the collected rinsing liquid is drained to the outside of the high pressure vessel from at least one of outlets provided on the top and bottom of the high pressure vessel. Still more, desirably, the convection of the fluid nearby the substrate should be prevented by adjusting at least one of temperatures at the upper and lower sides of the substrate and eliminating a temperature difference on the upper and lower sides of the substrate. Similarly, desirably, after the fluid is introduced into the high pressure vessel and predetermined pressure is reached, a rinsing liquid should be collected by stopping the introduction of the fluid and halting a flow of the fluid inside the high pressure vessel through a step of holding a predetermined pressure state.

Further, desirably, in the present invention, the density of the fluid should be changed into a predetermined density of 0.65 to 0.95 g/ml and the substrate should be silicon. Similarly, desirably, when the fluid is introduced into the high pressure vessel, a pressure rise speed or an introduction speed into the high pressure vessel should be controlled and the turbidity of the fluid and rinsing liquid should be suppressed.

Desirably, the present invention should repeat said step of forming a specific gravity difference and collecting said rinsing liquid for more than two types of rinsing liquids having different gravities to remove each of the rinsing liquids sequentially. Desirably, the present invention should perform the introduction step by changing an introduction speed, and repeat the introduction step and the halt step.

The present invention is a microstructure drying treatment apparatus that has a high pressure vessel in which a substrate having a microstructure formed through processes of development and rinsing after exposure is installed in a state immersed in or wet with a rinsing liquid and a fluid tank for storing a fluid in a liquid or supercritical state, said fluid being gas at normal pressure and liquid under high pressure. The apparatus has an introduction port, provided in the high pressure vessel, that introduces the fluid into the high pressure vessel and a fluid outlet, provided in the high pressure vessel, that drains the fluid inside the high pressure vessel to the outside of the high pressure vessel. The apparatus has a temperature or pressure adjusting means that changes at least one of temperature and pressure of the fluid inside the high pressure vessel and an outlet, provided at the upper or lower side, that drains the rinsing liquid collected at the upper or lower side inside the high pressure vessel to the outside of the high pressure vessel according to a specific gravity difference between the rinsing liquid and the fluid inside the high pressure vessel.

Further, the microstructure drying treatment apparatus of the present invention is provided with a high pressure pump which compression-transports a fluid to a high pressure vessel to supply a sufficient fluid to dissolve a rinsing liquid inside a high pressure vessel. Further, the apparatus has a control means performs a substitution process that reduces a flow rate at which a substitution fluid is compression-transported by a high pressure pump to zero and minimizes, that is, reduces the speed of the substitution fluid inside the high pressure vessel to zero to converge and collect the turbidity of the substitution fluid and the rinsing liquid that occurs to no small extent when the substitution fluid is introduced.

Still more, the microstructure drying treatment apparatus of the present invention can drain a rinsing liquid that is not dissolved in a fluid selectively by providing at least an outlet on the top and bottom of a high pressure vessel even when two or more types of a rinsing liquid having a higher specific gravity than a substitution fluid and a rinsing liquid having a lower specific gravity than the substitution fluid are used. Further, the apparatus can minimize the conviction of the rinsing liquid and the substitution fluid in a turbid state, and converge and collect the turbid state in a short time by providing a thermoregulator at the upper and the lower sides of a substrate.

Further, the present invention is a high pressure vessel for a microstructure drying treatment apparatus that has a vessel composed of an upper vessel portion and a lower vessel portion and a substrate holder provided in the lower vessel portion in which a substrate having a microstructure formed through development and rinsing processes after exposure is installed on the surface of the microstructure in a state immersed in and wet with the rinsing liquid. The high pressure vessel has an introduction port, provided in the vessel, that introduces a fluid that is gas at normal pressure and is liquid under high pressure into the vessel and a fluid outlet, provided in the lower vessel, that drains the fluid inside the vessel. The high pressure vessel has a rinsing outlet, provided in at least one of the upper vessel portion and the lower vessel portion, that drains the rinsing liquid collected according to a specific gravity difference between the rinsing liquid and fluid caused by at least one of changes of the temperature and the pressure of the fluid.

Desirably, the present invention should form each of a heating means and a cooling means that heats and cools the upper vessel portion and the lower vessel portion in each of the upper vessel portion and the lower vessel portion. Desirably, the present invention should provide the heating means in at least one of the portions that correspond to the top and bottom of the substrate installed on the substrate holder.

As described above, the present invention introduces a fluid such as carbon dioxide, that is gas at normal temperature and pressure and is liquid under high pressure, in a liquid state as a substitution solvent of a rinsing liquid into a high pressure vessel that works as a drying treatment chamber in which a sample having a microstructure, such as a resist substrate, after exposure, development, and rinsing is installed. In resist drying treatment that utilizes the substitution effect of the rinsing liquid caused by the solubility of the fluid that is introduced in the liquid state, the present invention can minimize the amount of the rinsing liquid that is left in the high pressure vessel by changing temperature and pressure, controlling the specific gravity of a substitution fluid, collecting the rinsing liquid that is not dissolved in the fluid at the upper or lower side, and draining the rinsing liquid to the outside of the high pressure vessel selectively. Further, because the present invention can maintain the density of the substitution fluid relative to the rinsing liquid to the minimum, it can minimize even a reduction in solubility, and obtain high substitution efficiency and shorten a substitution process by suppressing the reduction of the solubility to the rinsing liquid that is left between the microstructures.

As a result, the present invention can solve a defect of a conventional critical point drying method that this drying treatment time is long and a defect that a uniform drying result cannot be obtained for a large-caliber substrate. The present invention can dry, uniformly without generating pattern collapse, such a substrate that has a microstructure of a resist to fabricate an LSI on a large scale, a microstructure of a pattern width of less than 70 nm, in particular, a pattern width of less than 30 nm and a diameter of 100 mm or more. The present invention can provide such a treatment speed that it is applied to a device production line.

BRIEF DESCRIPTION OF THE DRAWINGS

FIG. 4A is a sectional view of the state of a substrate 101, installed in a high pressure vessel 103, the surface of which is filled with a rinsing liquid;

FIG. 4B shows a state in which liquid carbon dioxide is introduced into the high pressure vessel 103 and the pressure increases above critical pressure immediately after the liquid carbon dioxide is introduced;

FIG. 4C shows the turbid state is slightly left;

FIG. 4D shows the turbidity converges;

FIG. 5A is identical with the case where a flow of the liquid carbon dioxide is generated in the high pressure vessel 103;

FIG. 5B is identical with the case where a flow of the liquid carbon dioxide is generated in the high pressure vessel 103;

FIG. 5C shows a rinsing liquid 301 that is left slightly on the surface of a microstructure 302 and a particle drop 306 of a turbid rinsing liquid will be coupled.

DETAILED DESCRIPTION OF THE PREFERRED EMBODIMENTS

First Embodiment

Figure 1:
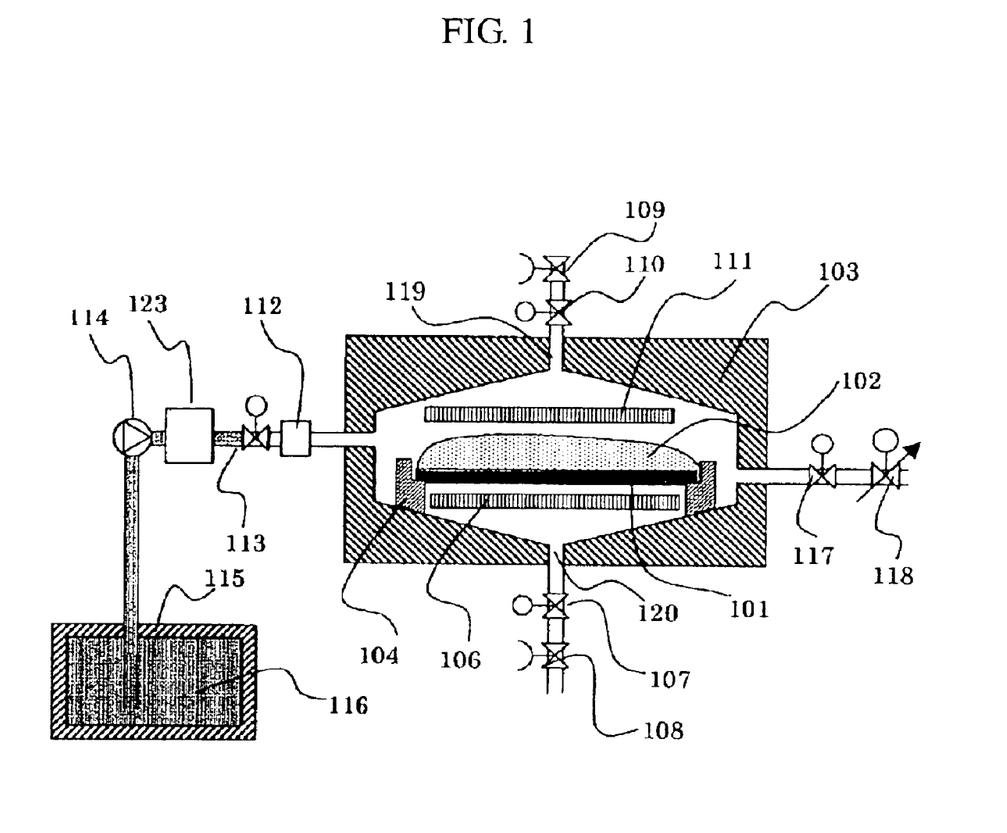
FIG. 1 is a sectional view of a microstructure drying treatment apparatus showing an example of the present invention.

FIG. 1 is a sectional view showing an example of a microstructure drying treatment apparatus of the present invention. A high pressure vessel 103 that is a drying chamber of a substrate 101 has an upper lid portion and a lower vessel portion. The lid portion is opened and the substrate 101 is installed. The lid portion and the lower vessel portion use SUS 304 steel. The former portion is fixed and the latter portion is movable. Even either can be used. Further, the lid portion and the lower vessel portion have a passage into which a coolant that cools the inside of the vessel and a heating element. Moreover, the substrate 101 has a microstructure on the surface through development and rinsing processes after exposure. The surface is wholly coated with a rinsing liquid 102, and the substrate 101 is installed on a substrate holder 104 provided in the high pressure vessel 103. The high pressure vessel 103 is piped to a high pressure pump 114 and a liquid carbon dioxide vessel 115 via a valve 113 and a pressure control valve 118 via a valve 117. The high pressure vessel 103 is connected to back-pressure control valves 109 and 108 via a valve 110 on the top and a valve 107 at the bottom, respectively. When preset pressure is exceeded, a rinsing liquid inside a high pressure vessel is primarily drained from an outlet 119 and an outlet 120 provided in the lid portion and the lower vessel portion, respectively.

The high pressure vessel 103 has the thermoregulation mechanism of cooling by a coolant passage formed inside the vessel and heating by a heating element, and can control the temperature of a fluid within a range of 0 to 60° C. Further, heating elements as thermoregulators 111 and 106 are provided on the top and bottom of the substrate 101 even in a high pressure vessel, respectively, to suppress conviction according to a temperature difference nearby the substrate 101, in particular, of the side having a microstructure to the minimum.

A drying process of this embodiment is described below.

(1) An EB resist (ZEP-7000 manufactured by Zeon Corporation) of a film thickness of 160 nm is deposited and dried on a silicon substrate of a diameter of 100 mm. Subsequently, after a pattern is drawn using an electron beam, the pattern is developed with n-hexyl acetate for 90 seconds and cleansed with 2-propanol for 100 seconds. Then the substrate 101 in which a microstructure is formed on the surface and that is covered with a rinsing liquid is installed in the substrate holder 104 of the high pressure vessel 103. At this occasion, the substrate 101 is coated with the 2-propanol 102 that is the rinsing liquid and can be soluble in liquid carbon dioxide or supercritical carbon dioxide, or the substrate 101 is immersed in the 2-propanol 102.

(2) After the substrate 101 is installed in the substrate holder 104, the high pressure vessel 103 is made airtight, then the valves 117, 107, and 110 are closed.

(3) When the valve 113 is opened, carbon dioxide 116 in a liquid state of 5° C. is introduced into the high pressure vessel 103. At this occasion, a pressure controller 123 controls the pressure to rise up to 14 MPa in about 2 MPa per minute so that a microstructure formed on the substrate 101 cannot be damaged, and the turbidity of the rinsing liquid 102 and liquid carbon dioxide are suppressed to the minimum. The liquid carbon dioxide introduced into the high pressure vessel 103 passes through a filter 112 and impurities are removed.

(4) When the temperature of the high pressure vessel 103 is decreased by the circulation of water of 5° C. and is controlled to about 5° C., the specific gravity of liquid carbon dioxide amounts to 0.95 g/ml. Accordingly, because a specific gravity difference of the liquid carbon dioxide for a specific gravity of 0.80 g/ml of 2-propanol that is a rinsing liquid is on the order of about 0.15, the 2-propanol is collected on the top inside the high pressure vessel 103. The pressure rise up to 14 MPa and the temperature rise up to 5° C. can be performed at the same time.

Figure 2:
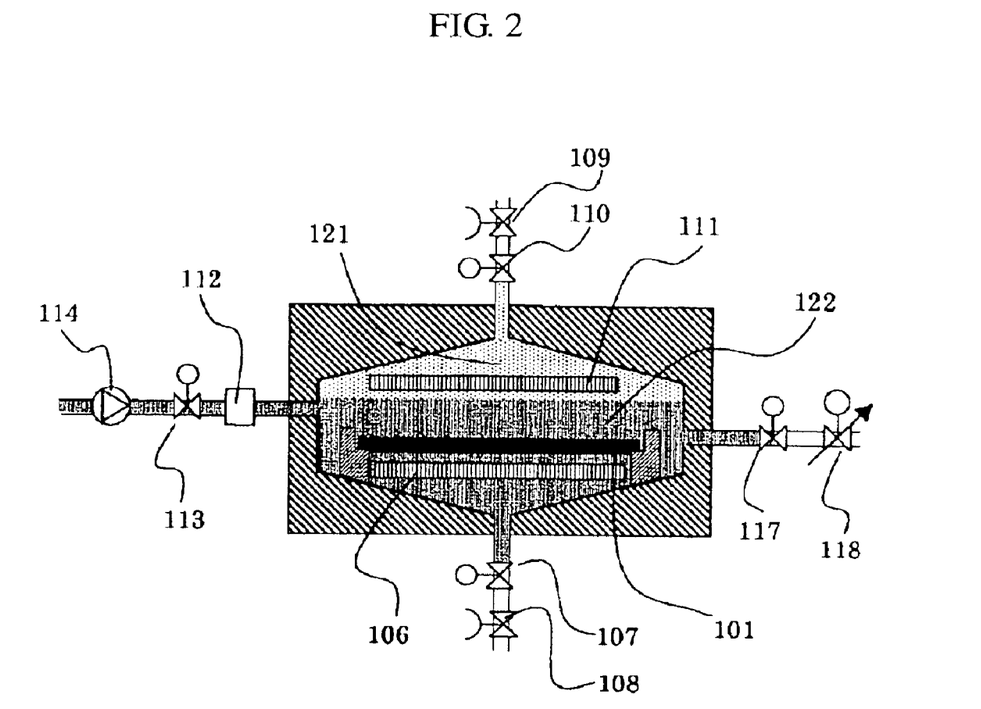
FIG. 2 is a sectional view of the microstructure drying treatment apparatus after temperature is changed in the present invention.

(5) FIG. 2 is a schematic section inside the high pressure vessel 103 at this occasion. When the high pressure vessel 103 is filled with liquid carbon dioxide and the pressure amounts to 14 MPa, the compression transport of the liquid carbon dioxide is halted by a high pressure pump to prevent a flow of the liquid carbon dioxide from occurring inside a high pressure vessel so that the turbid state of the liquid carbon dioxide and 2-propanol is converged. At the same time, the thermoregulators 106 and 111 are controlled to 5° C. to suppress the conviction of the liquid carbon dioxide according to a temperature difference between the top and bottom of the high pressure vessel to the minimum.

Figure 3:
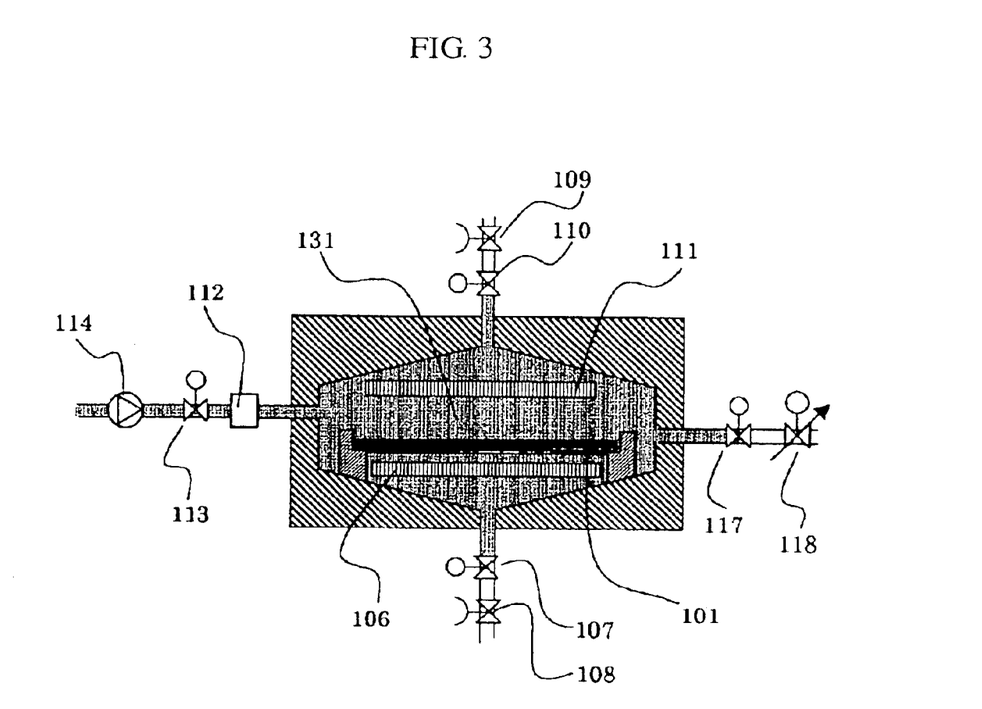
FIG. 3 is a sectional view of the microstructure drying treatment apparatus after a rinsing liquid is drained in the present invention.

(6) After the turbidity of 2-propanol and liquid carbon dioxide are converged and both are separated each other, the compression transport of the liquid carbon dioxide is resumed by the high pressure pump 114. When the valve 110 is opened, the 2-propanol collected on the top inside the high pressure vessel 103 can be drained selectively from the back-pressure control valve 109 via the outlet 119. FIG. 3 is a schematic sectional view inside a high pressure vessel at this occasion, and the high pressure vessel 103 is almost filled with only liquid carbon dioxide 131. Subsequently, the rinsing liquid on the microstructure of the substrate 101 is almost removed.

(7) The compression transport of liquid carbon dioxide is halted by the high pressure pump 114 and the temperature of the high pressure vessel 103 is increased to 35° C. by a heating element. The pressure inside the high pressure vessel 103 is increased. When preset pressure of 14 MPa is exceeded, however, the liquid carbon dioxide is drained from the back-pressure control valve 109 and the pressure inside the high pressure vessel 103 is retained at 14 MPa. The liquid carbon dioxide inside the high pressure vessel 103 changes a state into a supercritical state by this temperature change. In this state change, the surface tension of the liquid carbon dioxide will operate on a microstructure. Accordingly, a rinsing liquid in the microstructure is dissolved into the carbon dioxide in a supercritical state and the inside of the microstructure is substituted for the carbon dioxide in the supercritical state.

(8) The valves 113 and 110 are closed, and the valve 117 is opened. Subsequently, with the temperature retained at 35° C., supercritical carbon dioxide is drained from the pressure control valve 118. When the pressure inside a high pressure vessel amounts to less than 7.38 MPa, the carbon dioxide filling the high pressure vessel 103 changes it's state into gas. Further, when drainage is continued by the pressure control valve 118 and the pressure inside the high pressure vessel reaches atmospheric pressure, drying is terminated.

The aforementioned timing in each process is preset by performing each preparatory test.

Figure 4:
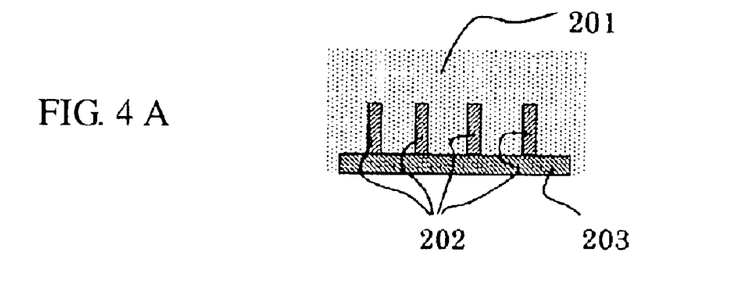
FIG. 4 is a sectional view for describing a substitution process of a fluid in a liquid state and a rinsing liquid of the present invention.

FIGS. 4A to 4D are sectional views showing a substitution process of a fluid in a liquid state and a rinsing liquid in the aforementioned process according to an embodiment of the present invention. FIG. 4A is a sectional view showing the state of the substitute 101, installed in the high vessel 103, the surface of which is filled with the rinsing liquid. A microstructure 202 formed on a substrate base 203 is completely covered with a rinsing liquid (2-propanol) 201. A phase boundary between gas and a liquid does not appear in a pattern and the surface tension of the rinsing liquid 201 does not operates. Consequently, no pattern collapse occurs.

FIG. 4B shows a state in which liquid carbon dioxide is introduced into the high pressure vessel 103 and the pressure increases above critical pressure immediately after the liquid carbon dioxide is introduced. At this occasion, the rinsing liquid 201 between the microstructures 202 is not substituted for the liquid carbon dioxide. Liquid carbon dioxide 205 contains many particle drops 204 of a rinsing liquid, and they are almost in a turbid state. When several minutes elapse, the particle drops 204 of the rinsing liquid are separated according to a specific gravity difference between the rinsing liquid and the liquid carbon dioxide and cohere upward. The turbid state is slightly left, and turns into the state shown in FIG. 4C. At this occasion, when a flow of the liquid carbon dioxide is generated in a high pressure vessel, the turbidity will not converge and this state will be continued. When conviction is suppressed by halting a high pressure pump and heating the substrate 101 so that a difference in the temperature of a substrate can be eliminated, the turbidity converges as shown in FIG. 4D, and liquid carbon dioxide 209 and rinsing liquid 208 that cannot be dissolved in liquid carbon dioxide are separated each other on the microstructure 202.

In this state, when the top valve 110 of the high pressure vessel 103 is opened and carbon dioxide is introduced into the high pressure vessel 103 by the high pressure pump 114, the rinsing liquid 208 can be drained selectively from the output 119 to the outside of the high pressure vessel, thereby maximizing the solubility of the rinsing liquid 209. Accordingly, because the rinsing liquid that is left between the microstructures 202 is a very small amount in comparison with the amount of the upper rinsing liquid, it can be substituted for liquid carbon dioxide in a short time. That is, though the amount of the rinsing liquid on the substrate 101 is a very large amount as much as several thousand times in comparison with the amount of the rinsing liquid between microstructures, most of the rinsing liquid on the substrate 101 can be removed in a short time by the aforementioned method.

Figure 5:
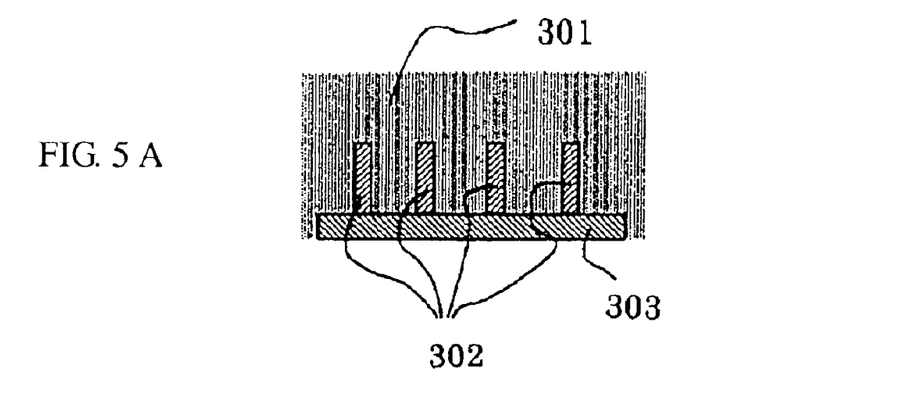
FIG. 5 is a sectional view for describing the substitution process when the rinsing liquid and the fluid in the liquid state generate a flow inside a high pressure vessel in a turbid state.

FIGS. 5A to 5C are sectional views showing a substitution process when a flow is generated in a high pressure vessel in a turbid state of a rinsing liquid and liquid carbon dioxide. FIG. 5A and FIG. 5B are identical with the case that a flow of the liquid carbon dioxide is generated in the high pressure vessel 103. If the flow is generated in the high pressure vessel 103 by the compression transport of the liquid carbon dioxide with the high pressure pump 114 and by conviction, however, a rinsing liquid 301 that is left slightly on the surface of a microstructure 302 and a particle drop 306 of a turbid rinsing liquid will be coupled as shown in FIG. 5C. Accordingly, in this case, first, the substitution process will require a long time of 60 minutes or more because the rinsing liquid that is left between the microstructures 302 cannot be substituted before the rinsing liquid on the surface of the microstructure 302 is substituted for the liquid carbon dioxide. Because the amount of the rinsing liquid coupled and accumulated on the surface of this microstructure depends on a flow, a uniform drying result cannot be obtained.

Figure 6:
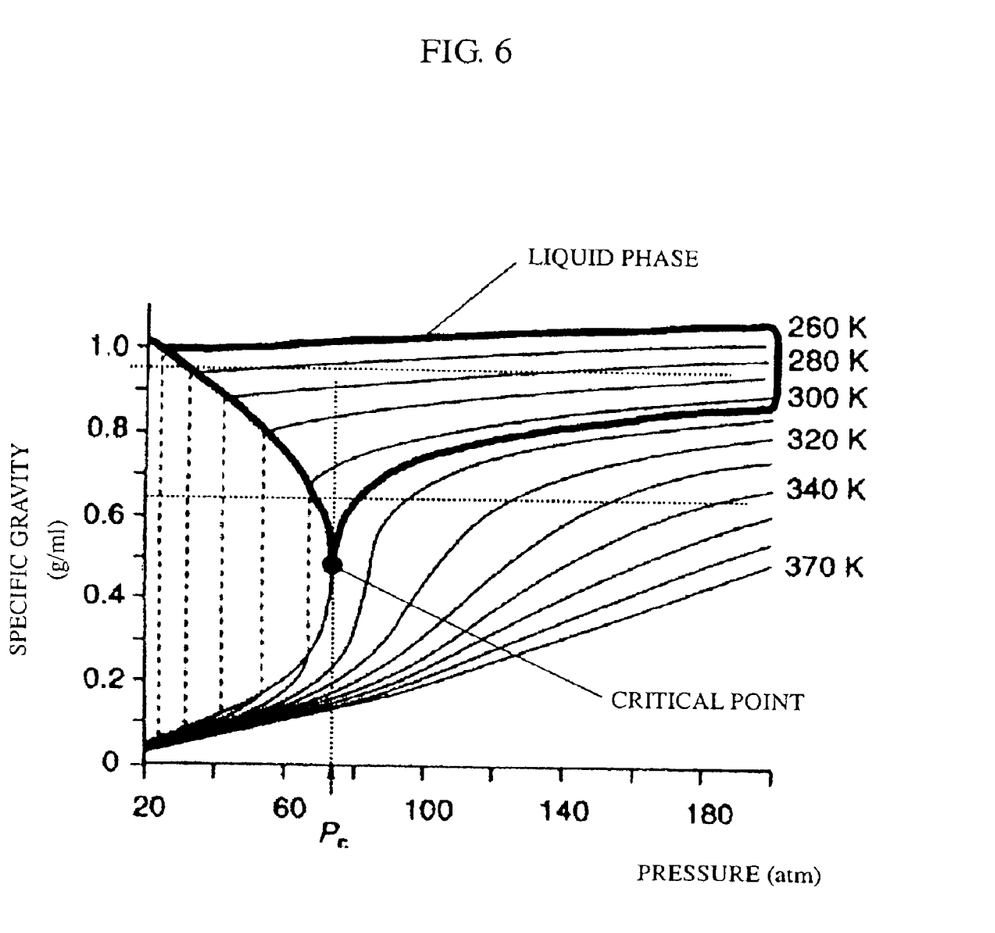
FIG. 6 is a relation diagram of the P-D-T (pressure, density, temperature) of carbon dioxide.

This embodiment shows an example in which carbon dioxide that enters a supercritical state at relatively low temperatures and pressure is used as a fluid that is utilized for drying a microstructure. As shown in the P-D-T (pressure-density-temperature) state diagram of the carbon dioxide of FIG. 6, the critical pressure of carbon dioxide is 7.38 MPa and the critical temperature is 31° C. Further, the density of liquid carbon dioxide can be varied from 0.65 to 0.95 g/ml by varying temperature from 0 to 30° C. and pressure from 3 MPa to 14 MPa, and the process of this embodiment can be achieved.

This embodiment has a fine pattern of less than 30 nm, and can dry a large-caliber substrate of 100 mm or more uniformly and in a short time without generating pattern collapse.

Second Embodiment

After processes (1) to (3) of the first embodiment, when the temperature of liquid carbon dioxide introduced at 5° C. in process (4) is controlled at about 28° C. by a heat element provided in the high pressure vessel 103, the specific gravity of the liquid carbon dioxide amounts to 0.70 g/ml and a specific gravity difference of the liquid carbon dioxide for the specific gravity of 0.80 g/ml of 2-propanol that is a rinsing liquid amounts to on the order of about 0.10. Accordingly, the 2-propanol can be collected at the bottom inside the high pressure vessel 103. Further, the substrate 101 can be heated uniformly by the top and bottom thermoregulators 106 and 111.

The 2-propanol collected at the bottom is selectively drained from the outlet 120 by performing operation in the same manner as process of (5) or later of the first embodiment. Subsequently, drying is terminated by decreasing the pressure up to atmospheric pressure via the same process as the first embodiment. Even in this embodiment, the amount of the rinsing liquid on the substrate 101 is a very large amount as much as several thousand times in comparison with the amount of the rinsing liquid between microstructures in the same manner as the first embodiment. Nevertheless, most of the rinsing liquid on the substrate can be removed in a short time, and consequently the rinsing liquid that is left between the microstructures 202 can be substituted in a short time. Further, even this embodiment has a fine pattern of less than 30 nm, and can dry a large-caliber substrate of 100 mm or more uniformly and in a short time without generating pattern collapse.

Third Embodiment

This embodiment can drain, substitute, and dry a rinsing liquid effectively in a short time by combining all processes in the first embodiment and all processes in the second embodiment even if two types of rinsing liquids are used at the same time. Further, this embodiment has also a fine pattern of less than 30 nm, and can dry a large-caliber substrate of 100 mm or more uniformly and in a short time without generating pattern collapse.

The present invention can provide a microstructure drying treatment method that can dry a substrate having a microstructure uniformly and in a short time of about several minutes without generating pattern collapse, and its apparatus and vessel.

What is claimed is:

1. A microstructure drying treatment method, comprising the steps of:

introducing a fluid in a liquid or supercritical state into a high pressure vessel, said fluid being gas at normal temperature and pressure and liquid under high pressure, and said high pressure vessel in which a substrate having a microstructure in a state immersed in or wet with a rinsing liquid is installed; and forming a specific gravity difference between the rinsing liquid and fluid of said high pressure vessel and collecting said rinsing liquid to the top or bottom of said high pressure vessel by changing at least one of temperature and pressure of said fluid to change the specific gravity of said high pressure vessel.

2. The microstructure drying treatment method according to claim 1, wherein said fluid is liquid, and said liquid is compression-transported to said high pressure vessel.

3. The microstructure drying treatment method according to claim 1, wherein said collected rinsing liquid is drained to the outside of said high pressure vessel from at least one of outlets provided on the top and bottom of said high pressure vessel.

4. The microstructure drying treatment method according to claim 1, wherein at least one of temperatures at the upper and lower sides of said substrate is adjusted to eliminate a temperature difference at the upper and lower sides of said substrate.

5. The microstructure drying treatment method according to claim 1, further comprising a step of halting the introduction of said fluid after the pressure inside said high pressure vessel reaches predetermined pressure, and holding said predetermined pressure state.

6. The microstructure drying treatment method according to claim 1, wherein the density of said fluid changes into a predetermined density of 0.65 to 0.95 g/ml.

7. The microstructure drying treatment method according to claim 1, wherein said introduction step is performed at a predetermined pressure rise speed.

8. The microstructure drying treatment method according to claim 1, wherein said step of forming a specific gravity difference and collecting said rinsing liquid is repeated for more than two types of rinsing liquids having different gravities.

9. The microstructure drying treatment method according to claim 1, wherein said introduction step has a step of introducing said fluid by changing its introduction speed.

10. The microstructure drying treatment method according to claim 1, wherein said introduction step and an introduction or halt step that halts the introduction are repeated.

11. A microstructure drying treatment apparatus for drying a substrate having a microstructure formed through development and rinsing processes after exposure, and in a state in which the surface of said microstructure is immersed in or wet with said rinsing liquid, comprising:

a high pressure vessel for installing said substrate;

a fluid tank for storing a fluid in a liquid state or supercritical state, said fluid being gas at atmospheric pressure and liquid under high pressure;

an introduction port, provided in said high pressure vessel, for introducing said fluid into said high pressure vessel;

a fluid outlet, provided in said high pressure vessel, for draining said fluid inside said high pressure vessel to the outside of said high pressure vessel;

a temperature or pressure adjustment means for changing at least one of temperature and pressure of said fluid inside said high pressure vessel to change the specific gravity of said fluid; and a rinsing liquid outlet, provided at the upper side or lower side, for draining said rinsing liquid collected at the upper side or lower side inside said high pressure vessel to the outside of said high pressure vessel according to a specific gravity difference between said rinsing liquid and fluid inside said high pressure vessel.

12. The microstructure drying treatment apparatus according to claim 11, further comprising a high pressure pump for compression-transporting said fluid to said high pressure vessel.

13. The microstructure drying treatment apparatus according to claim 11, further comprising a thermoregulator for heating said substrate in at least one of upper and lower sides of said substrate.

14. The microstructure drying treatment apparatus according to claim 11, further comprising a pressure controller for controlling the pressure of said fluid introduced into said high pressure vessel.

15. The microstructure drying treatment apparatus according to claim 11, further comprising a pressure rise speed control means for controlling the pressure rise speed inside said high pressure vessel when said fluid is introduced into said high pressure vessel.

16. The microstructure drying treatment apparatus according to claim 11, further comprising a control means for repeating the introduction step of said fluid and said introduction or halt step.

17. A high pressure vessel for a microstructure drying treatment apparatus, comprising:

a vessel having an upper vessel portion and a lower vessel portion;

a substrate holder, provided in the lower vessel portion, for installing a substrate having a microstructure formed through development and rinsing processes after exposure;

an introduction port, provided in said vessel, for introducing a fluid into said vessel, said fluid being gas at atmospheric pressure and liquid under high pressure;

a fluid outlet, provided in the lower vessel, for draining said fluid into said vessel; and a rinsing liquid outlet, provided in at least one of said upper vessel portion and lower vessel portion, for draining said rinsing liquid collected according to a specific gravity difference between said rinsing liquid and fluid due to at least one of changes of said temperature and pressure of said fluid.

18. The high pressure vessel for the microstructure drying treatment apparatus according to claim 17, wherein each of a heating means and a cooling means for heating and cooling said upper vessel portion and lower vessel portion is formed in each of said upper vessel portion and lower vessel portion.

19. The high pressure vessel for the microstructure drying treatment apparatus according to claim 17, wherein a heating means is provided in at least one of portions that correspond to the top and bottom of said substrate installed in said substrate holder.

* * * * *